United States Patent [19]

Tanei et al.

[11] Patent Number: 5,342,674
[45] Date of Patent: Aug. 30, 1994

[54] CERAMIC COMPOSITION AND CERAMIC CIRCUIT BOARD

[75] Inventors: Hirayoshi Tanei; Shoichi Iwanaga, both of Yokohama, Japan

[73] Assignee: Hitachi, Ltd., Tokyo, Japan

[21] Appl. No.: 28,219

[22] Filed: Mar. 9, 1993

[30] Foreign Application Priority Data

Mar. 10, 1992 [JP] Japan .................................. 4-051298

[51] Int. Cl.$^5$ ............................. B32B 3/00; C03C 1/00
[52] U.S. Cl. ................................. 428/209; 428/426; 428/901; 501/32; 501/65; 501/66; 174/250; 361/748
[58] Field of Search ................. 501/9, 11, 17, 32, 65, 501/66; 428/209, 210, 426, 428, 901; 361/397, 380; 174/250

[56] References Cited

U.S. PATENT DOCUMENTS

| | | | |
|---|---|---|---|
| 4,642,148 | 2/1987 | Kurihara | 501/9 |
| 4,654,095 | 3/1987 | Steinberg | 501/17 |
| 4,764,233 | 8/1988 | Ogihara et al. | 501/11 |
| 4,939,021 | 7/1990 | Aoki et al. | 501/32 |
| 5,024,975 | 6/1991 | Hartmann | 501/17 |
| 5,079,194 | 1/1992 | Jean et al. | 501/32 |

*Primary Examiner*—Karl Group
*Assistant Examiner*—Michael Marcheschi
*Attorney, Agent, or Firm*—Antonelli, Terry, Stout & Kraus

[57] ABSTRACT

A ceramic composition comprising 55-70 vol % of a borosilicate glass consisting of 65-88 wt % of $SiO_2$, 5-25 wt % of $B_2O_3$, 1-5 wt % of one or more of $Li_2O$, $K_2O$ and $Na_2O$, and 0-5 wt % of $Al_2O_3$, 5-30 vol % of alumina as filler, 5-35 vol % of cordierite and 0-20 vol % of quartz glass is provided for a ceramic circuit board for an electronic device such as an electronic computer.

6 Claims, No Drawings

CERAMIC COMPOSITION AND CERAMIC CIRCUIT BOARD

BACKGROUND OF THE INVENTION

1. Field of the Invention

The present invention relates to a ceramic composition for use in a ceramic circuit board having an integrated circuit mounted thereon and the circuit board, more particularly to a ceramic composition capable of being sintered at a low temperature, lower than 1,000° C., and a multilayered ceramic circuit board produced by sintering a conducting layer and an insulating layer together. The ceramic circuit board is used for an electronic device, particularly an electronic computer.

2. Description of Related Art

Hitherto there has been mainly used alumina, $Al_2O_3$, for a multilayered circuit board, which has a silicon semiconductor integrated circuit element, and a high-melting point metal such as molybdenum, Mo, or tungsten, W, as a conducting material capable of being sintered together with alumina. However, since alumina has a coefficient of thermal expansion as high as about $7 \times 10^{-6}$/°C., the conducting connection between an alumina board and a silicon semiconductor element undergoes a large amount of stress, when the board and the element are connected directly to each other. For this reason prior multilayered circuit boards are not reliable. Furthermore, since alumina has a relatively higher relative permittivity of about 10, the signal propagation speed thereof is not satisfied. In addition, the abovementioned high-melting point metal has a relatively high resistance. In order to solve such problems, Japanese Patent Kokoku (Post-Exam. Publn.) No. 2-49550 and Japanese Patent Kokai (Laid-Open) No. 63-40397 proposed to substitute for alumina a glass ceramic as insulating material, which is able to be sintered at a temperature of not higher than 1,010° C. and has a relative permittivity of 6 or less and a coefficient of thermal expansion near that of silicon and, for the high-melting point metal as conducting material, copper having a lower resistance than that of the high-melting point metal.

In order to improve the performance and reliability of the ceramic circuit board for mounting the silicon semiconductor integrated circuit element thereon, the ceramics for the board are required (1) to be able to be sintered at a temperature of not higher than 1,000° C., preferably 850° to 950° C. and (2) have a low relative permittivity of less than 6.0, preferably 5.0, (3) a coefficient of thermal expansion near that of silicon, i.e., $(3.1 \pm 1.0) \times 10^{-6}$/°C., and (4) a higher bending strength.

SUMMARY OF THE INVENTION

One object of the present invention is to provide a ceramic composition satisfied with the four requirements above.

It is another object of the present invention to provide a multilayered ceramic circuit board using such a ceramic composition.

It is a further object of the present invention to provide an electronic calculator or other electronic devices using such a multilayered ceramic circuit board.

DETAILED DESCRIPTION OF PREFERRED EMBODIMENTS

The objects of the present invention is achieved by using as an insulating material for a ceramic circuit board a ceramic composition comprising the specific amounts of a borosilicate glass, alumina, cordierite and quartz glass. Particularly, such a ceramic composition comprises 55–70 vol % (47–63 wt %) of a borosilicate glass, 5–30 vol % (8–44 wt %) of alumina as filler, 5–35 vol % (5–37 wt %) of cordierite as filler and 0–20 vol % (0–18 wt %) of quartz glass as filler, preferably 55–65 vol % of a borosilicate glass, 10–25 vol % of alumina, 15–25 vol % of cordierite and 0–10 vol % of quartz glass. The borosilicate glass used has a composition of 65–88 wt % of $SiO_2$, 5–25 wt % of $B_2O_3$, 1–5 wt % of one or more of $Li_2O$, $K_2O$ and $Na_2O$, and 0–5 wt % of $Al_2O_3$ and a softening point of 750°–880° C. and a coefficient of thermal expansion of $1.0$–$3.8 \times 10^{-6}$/°C.

In order to obtain a high performance multilayered ceramic circuit board, it is required that (1) a ceramic composition constituting the board is sinterable at a temperature of 1,000° C. or lower so that a lower resistance metal such as copper, silver or gold may be used, (2) has a low relative permittivity, (3) has a coefficient of thermal expansion near that of silicon and (4) has a high mechanical strength.

The borosilicate glass of the present invention has a softening point of 750° to 880° C. and hence is softened when fired at a temperature of 1,000° C. or lower so that the glass acts as a sintering promoter and permits the formation of a continuous phase (matrix) of the ceramic circuit board of the present invention. Furthermore, since the borosilicate glass has so low a relative permittivity as about 4.2 and, therefore, it contributes to the lowering of the relative permittivity of the composition according to the present invention. The borosilicate glass of the present invention has so low a coefficient of thermal expansion as $1.0$–$3.8 \times 10^{-6}$/°C. and, therefore, to the composition may be added a filler, such as alumina, having a higher coefficient of thermal expansion. Alumina as the first filler in the present invention is contained as particulate dispersion in the borosilicate glass matrix and contributes to improvement of the mechanical strength of the ceramic circuit board of the present invention.

If the amount of the alumina is less than 5 vol % (8 wt %), then the mechanical strength of the circuit board of the present invention cannot effectively be improved. If the amount of the alumina is more than 30 vol % (44 wt %), then the relative permittivity and coefficient of thermal expansion of the circuit board according to the present invention are improperly raised.

The cordierite as the second filler is contained as particulate dispersion in the borosilicate glass matrix and contributes to the improvement of the mechanical strength and the maintenance of the low relative permittivity and low coefficient of thermal expansion.

If the amount of the cordierite is less than 5 vol % (5 wt %), then the mechanical strength of the circuit board cannot effectively be improved. If the amount is more than 35 vol % (37 wt %), then the coefficient of thermal expansion be improperly lowered.

The quartz glass as the third filler is not an essential constituent, but it may contribute to the reduction of the relative permittivity and coefficient of thermal expansion. If the amount of the quartz glass exceeds 20 vol %

(18 wt %), then the mechanical strength of the circuit board is improperly lowered.

The ceramic composition of the present invention can be sintered at a low temperature of 850°–1,000° C. and, therefore, it can be sintered together with a low resistance conductor such as copper, silver or gold, and it has a coefficient of thermal expansion of $2.4$–$4.0 \times 10^{-6}/°C$. which is very close to that of silicon, $3.1 \times 10^{-6}/°C$. Thus, the use of the ceramic composition according to the present invention for a circuit board gives only a very low stress to the connection conductor between the ceramic board and a silicon semiconductor element which is mounted on the circuit board and thus provides a highly reliable circuit board on which the silicon semiconductor element is mounted. Furthermore, the circuit board of the present invention has a low relative permittivity of 4.5–5.3 and, therefore, it gives a high signal propagation speed. Furthermore, it has a high bending strength of 17–26 kg/mm². Thus, the circuit board of the present invention is highly reliable.

The present invention will be illustrated below with reference to some examples.

EXAMPLES

To a borosilicate glass powder having a composition consisting of 78 wt % $SiO_2$, 19 wt % $B_2O_3$, 0.3 wt % $Al_2O_3$ and 3 wt % $K_2O$, and having a softening point of 840° C. and a coefficient of thermal expansion of $2.3 \times 10^{-6}/°C$., was added such amounts of alumina ($Al_2O_3$), cordierite ($2MgO \cdot 2Al_2O_3 \cdot 5SiO_2$), quartz glass ($SiO_2$ glass) as shown in Tables 1–4.

The compositions as shown in Tables 1–4 were prepared by wet-mixing the weighed amounts of the borosilicate glass with the fillers (total: 400 grams) in an alumina ball mill containing ethanol as medium for 24 hours, drying the resultant mixture, adding to the mixture a proper amount of an aqueous 3% PVA solution as binder, pelletizing the mixture and pressing the pellet at a pressure of 500 kg/cm² in a disc form of 60 mm in diameter and 5 mm in thickness, then maintaining the pressed disc at 500° C. for 1 hour to remove the binder in an electric furnace and further maintaining the disc at 850°–1,000° C. for 2 hours to prepare a sintered ceramic body.

The resultant sintered disc-shaped ceramic body was cut in a shape suitable for each of the measurements of coefficient of thermal expansion, relative permittivity and bending strength. The measurement of the coefficient of thermal expansion was conducted by a laser-inteference type dilatometer with a specimen of about 4 mm in diameter and about 15 mm in length to determine a coefficient of thermal expansion over a range of room temperature to 200° C. The measurement of the relative permittivity was conducted with a specimen of about 45 mm in diameter and 0.5 mm in thickness by coating the specimen on the opposite sides with a silver paste as electrode and determining the capacity of the specimen by an LCR meter under conditions of a cycle of 1 MHz and input signal level of 1 Vrms. The measurement of the bending strength was conducted in accordance with JIS (R1601) with a specimen of 38 mm in length, 4 mm in width and 3 mm in thickness. The span was 30 mm.

The results are shown in Tables 1–4.

The sintering temperature is such that the relative density of the sintered body is 95% or more when sintered for 2 hours.

As is understood from Tables 1–4, the sintering temperature is affected by the content of the borosilicate glass. The increase by 5 vol % of the content contributes to the lowering of the sintering temperature by 50° C. As is clear from Tables 1–4, the coefficient of thermal expansion, relative permittivity and mechanical strength are affected by the composition. Particularly, the strength is highly affected by the microstructure of the sintered body. Therefore, it is preferred that the particle size distribution of the raw material powders are adjusted and the process are optimized.

As shown in Tables 1–4, the ceramic composition of the present invention is sinterable at a temperature of 850°–1,000° C., and it gives a sintered body having a coefficient of thermal expansion of $2.4$–$4.0 \times 10^{-6}/°C$. which is very close to that of silicon, a low relative permittivity of 4.5–5.3 and a high bending strength of 17–26 kg/mm². Thus, the ceramic composition of the present invention is totally excellent.

TABLE 1

BOROSILICATE GLASS-FILLER COMPOSITIONS AND PROPERTIES

| Ex. No. | | Composition | | | | Sintering Temp. °C. | Coeff. Thermal Expansion $10^{-6}/°C$. | Rel. Permittivity | Bending Strength kg/mm² |
|---|---|---|---|---|---|---|---|---|---|
| | | Borosilicate glass | Alumina | Cordierite | Quartz glass | | | | |
| 1 | wt % | 47 | 24 | 20 | 9 | 1000 | 2.9 | 5.0 | 24 |
|   | vol % | 55 | 15 | 20 | 10 | | | | |
| 2 | wt % | 49 | 16 | 21 | 14 | 1000 | 2.6 | 4.8 | 22 |
|   | vol % | 55 | 10 | 20 | 15 | | | | |
| 3 | wt % | 49 | 17 | 16 | 18 | 1000 | 2.6 | 4.7 | 19 |
|   | vol % | 55 | 10 | 15 | 20 | | | | |
| 4 | wt % | 48 | 24 | 10 | 18 | 1000 | 3.0 | 4.8 | 20 |
|   | vol % | 55 | 15 | 10 | 20 | | | | |
| 5 | wt % | 47 | 31 | 5 | 17 | 1000 | 3.6 | 5.0 | 20 |
|   | vol % | 55 | 20 | 5 | 20 | | | | |
| 6 | wt % | 55 | 8 | 37 | 0 | 950 | 2.4 | 4.7 | 18 |
|   | vol % | 60 | 5 | 35 | 0 | | | | |
| 7 | wt % | 53 | 16 | 31 | 0 | 950 | 2.8 | 4.8 | 22 |
|   | vol % | 60 | 10 | 30 | 0 | | | | |
| 8 | wt % | 51 | 24 | 25 | 0 | 950 | 2.9 | 4.9 | 23 |
|   | vol % | 60 | 15 | 25 | 0 | | | | |
| 9 | wt % | 50 | 31 | 19 | 0 | 950 | 3.2 | 5.0 | 24 |
|   | vol % | 60 | 20 | 20 | 0 | | | | |

TABLE 2

BOROSILICATE GLASS-FILLER COMPOSITIONS AND PROPERTIES

| Ex. No. | | Composition | | | | Sintering Temp. °C. | Coeff. Thermal Expansion $10^{-6}$/°C. | Rel. Permittivity | Bending Strength kg/mm$^2$ |
|---|---|---|---|---|---|---|---|---|---|
| | | Borosilicate glass | Alumina | Cordierite | Quartz glass | | | | |
| 10 | wt % | 49 | 37 | 14 | 0 | 950 | 3.7 | 5.2 | 25 |
| | vol % | 60 | 25 | 15 | 0 | | | | |
| 11 | wt % | 47 | 44 | 9 | 0 | 950 | 4.0 | 5.3 | 24 |
| | vol % | 60 | 30 | 10 | 0 | | | | |
| 12 | wt % | 52 | 24 | 20 | 4 | 950 | 3.0 | 4.9 | 23 |
| | vol % | 60 | 15 | 20 | 5 | | | | |
| 13 | wt % | 54 | 16 | 21 | 9 | 950 | 2.6 | 4.7 | 21 |
| | vol % | 60 | 10 | 20 | 10 | | | | |
| 14 | wt % | 55 | 9 | 27 | 9 | 950 | 2.2 | 4.5 | 20 |
| | vol % | 60 | 5 | 25 | 10 | | | | |
| 15 | wt % | 52 | 24 | 15 | 9 | 950 | 3.0 | 4.9 | 24 |
| | vol % | 60 | 15 | 15 | 10 | | | | |
| 16 | wt % | 53 | 16 | 26 | 5 | 950 | 2.5 | 4.8 | 22 |
| | vol % | 60 | 10 | 25 | 5 | | | | |
| 17 | wt % | 56 | 9 | 22 | 14 | 950 | 2.3 | 4.5 | 17 |
| | vol % | 60 | 5 | 20 | 15 | | | | |
| 18 | wt % | 50 | 31 | 15 | 4 | 950 | 3.2 | 5.0 | 24 |
| | vol % | 60 | 20 | 15 | 5 | | | | |

TABLE 3

BOROSILICATE GLASS-FILLER COMPOSITIONS AND PROPERTIES

| Ex. No. | | Composition | | | | Sintering Temp. °C. | Coeff. Thermal Expansion $10^{-6}$/°C. | Rel. Permittivity | Bending Strength kg/mm$^2$ |
|---|---|---|---|---|---|---|---|---|---|
| | | Borosilicate glass | Alumina | Cordierite | Quartz glass | | | | |
| 19 | wt % | 54 | 17 | 16 | 14 | 950 | 2.6 | 4.6 | 18 |
| | vol % | 60 | 10 | 15 | 15 | | | | |
| 20 | wt % | 49 | 38 | 9 | 4 | 950 | 3.7 | 5.0 | 24 |
| | vol % | 60 | 25 | 10 | 5 | | | | |
| 21 | wt % | 50 | 31 | 10 | 9 | 950 | 3.4 | 4.9 | 22 |
| | vol % | 60 | 20 | 10 | 10 | | | | |
| 22 | wt % | 52 | 24 | 10 | 13 | 950 | 3.1 | 4.7 | 18 |
| | vol % | 60 | 15 | 10 | 15 | | | | |
| 23 | wt % | 58 | 16 | 26 | 0 | 900 | 2.6 | 4.8 | 20 |
| | vol % | 65 | 10 | 25 | 0 | | | | |
| 24 | wt % | 56 | 24 | 20 | 0 | 900 | 2.9 | 4.9 | 23 |
| | vol % | 65 | 15 | 20 | 0 | | | | |
| 25 | wt % | 58 | 17 | 21 | 4 | 900 | 2.6 | 4.7 | 18 |
| | vol % | 65 | 10 | 20 | 5 | | | | |
| 26 | wt % | 54 | 31 | 15 | 0 | 900 | 3.3 | 5.0 | 24 |
| | vol % | 65 | 20 | 15 | 0 | | | | |
| 27 | wt % | 56 | 24 | 15 | 5 | 900 | 3.0 | 4.8 | 20 |
| | vol % | 65 | 15 | 15 | 5 | | | | |

TABLE 4

BOROSILICATE GLASS-FILLER COMPOSITIONS AND PROPERTIES

| Ex. No. | | Composition | | | | Sintering Temp. °C. | Coeff. Thermal Expansion $10^{-6}$/°C. | Rel. Permittivity | Bending Strength kg/mm$^2$ |
|---|---|---|---|---|---|---|---|---|---|
| | | Borosilicate glass | Alumina | Cordierite | Quartz glass | | | | |
| 28 | wt % | 58 | 17 | 16 | 9 | 900 | 2.7 | 4.6 | 18 |
| | vol % | 65 | 10 | 15 | 10 | | | | |
| 29 | wt % | 53 | 38 | 9 | 0 | 900 | 3.7 | 5.0 | 26 |
| | vol % | 65 | 25 | 10 | 0 | | | | |
| 30 | wt % | 55 | 31 | 10 | 4 | 900 | 3.4 | 4.9 | 22 |
| | vol % | 65 | 20 | 10 | 5 | | | | |
| 31 | wt % | 57 | 24 | 10 | 9 | 900 | 3.1 | 4.7 | 18 |
| | vol % | 65 | 15 | 10 | 10 | | | | |
| 32 | wt % | 63 | 16 | 21 | 0 | 850 | 2.6 | 4.8 | 20 |
| | vol % | 70 | 10 | 20 | 0 | | | | |
| 33 | wt % | 61 | 24 | 15 | 0 | 850 | 3.3 | 4.8 | 21 |
| | vol % | 70 | 15 | 15 | 0 | | | | |
| 34 | wt % | 59 | 31 | 10 | 0 | 850 | 3.7 | 5.0 | 22 |
| | vol % | 70 | 20 | 10 | 0 | | | | |
| 35 | wt % | 61 | 24 | 10 | 4 | 850 | 3.1 | 4.7 | 19 |
| | vol % | 70 | 15 | 10 | 5 | | | | |
| 36 | wt % | 60 | 31 | 5 | 4 | 850 | 3.6 | 4.8 | 20 |
| | vol % | 70 | 20 | 5 | 5 | | | | |

What is claimed is:

1. A ceramic composition which comprises 55–70 vol % of a borosilicate glass, 5–30 vol % of alumina as filler, 5–35 vol % of cordierite and 0–20 vol % of quartz glass.

2. A ceramic composition which comprises 55–65 vol % of a borosilicate glass, 10–25 vol % of alumina as filler, 15–25 vol % of cordierite and 0–10 vol % of quartz glass.

3. A ceramic composition according to any one of claims 1 and 2, wherein said borosilicate glass consists of 65–88 wt % of $SiO_2$, 5–25 wt % of $B_2O_3$, 1–5 wt % of one or more of $Li_2O$, $K_2O$ and $Na_2O$, and 0–5 wt % of $Al_2O_3$, and has a softening point of 750°–880° C. and a coefficient of thermal expansion of $1.0–3.8 \times 10^{-6}/°C$.

4. A ceramic circuit board which comprises a ceramic layer and a conducting layer, said ceramic layer having a composition comprising 55–70 vol % of a borosilicate glass, 5–30 vol % of alumina as filler, 5–35 vol % of cordierite and 0–20 vol % of quartz glass.

5. A ceramic circuit board according to claim 4, wherein said borosilicate glass consists of 65–88 wt % of $SiO_2$, 5–25 wt % of $B_2O_3$, 1–5 wt % of one or more of $Li_2O$, $K_2O$ and $Na_2O$, and 0–5 wt % of $Al_2O_3$, and has a softening point of 750°–880° C. and a coefficient of thermal expansion of $1.0–3.8 \times 10^{-6}/°C$.

6. A ceramic circuit board according to claim 5, wherein said ceramic composition comprises 55–65 vol % of the borosilicate glass, 10–25 vol % of alumina as filler, 15–25 vol % of cordierite and 0–10 vol % of quartz glass.

* * * * *